US010784967B2

(12) United States Patent
Jin et al.

(10) Patent No.: US 10,784,967 B2
(45) Date of Patent: Sep. 22, 2020

(54) PHOTONIC RADIO-FREQUENCY RECEIVER WITH MIRROR FREQUENCY SUPPRESSION FUNCTION

(71) Applicant: Zhejiang University, Hangzhou (CN)

(72) Inventors: Xiaofeng Jin, Hangzhou (CN); Kang Xiao, Hangzhou (CN); Jichen Qiu, Hangzhou (CN); Xiangdong Jin, Hangzhou (CN); Xianbin Yu, Hangzhou (CN); Qinggui Tan, Hangzhou (CN); Bo Cong, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 16/788,308

(22) Filed: Feb. 12, 2020

(65) Prior Publication Data
US 2020/0266900 A1 Aug. 20, 2020

(51) Int. Cl.
*H04B 10/61* (2013.01)
*H04B 10/50* (2013.01)
*H04B 10/2575* (2013.01)
*H04J 14/06* (2006.01)
*G01R 29/26* (2006.01)
*G01B 9/02* (2006.01)

(52) U.S. Cl.
CPC ..... *H04B 10/616* (2013.01); *H04B 10/25752* (2013.01); *H04B 10/503* (2013.01); *G01B 9/02* (2013.01); *G01R 29/26* (2013.01); *H04B 10/50* (2013.01); *H04J 14/06* (2013.01)

(58) Field of Classification Search
CPC ............ H04B 10/616; H04B 10/25752; H04B 10/503; H04B 10/50; H04B 10/2575; G01R 29/26; G01B 9/02; H04J 14/06
USPC .......................................................... 398/38
See application file for complete search history.

(56) References Cited

U.S. PATENT DOCUMENTS

| 4,918,373 | A * | 4/1990 | Newberg | G01R 29/26 |
| | | | | 324/613 |
| 6,983,085 | B2 * | 1/2006 | Kataoka | H04B 10/505 |
| | | | | 385/1 |
| 9,158,137 | B1 * | 10/2015 | Abbas | H04B 10/50575 |
| 9,240,838 | B2 * | 1/2016 | Akiyama | H04B 10/564 |
| 9,683,928 | B2 * | 6/2017 | Swanson | G01N 21/39 |
| 9,998,232 | B2 * | 6/2018 | Yue | H04B 10/532 |
| 10,313,014 | B2 * | 6/2019 | Frankel | H04B 10/588 |

(Continued)

*Primary Examiner* — Abbas H Alagheband

(57) ABSTRACT

A photonic radio-frequency receiver with mirror frequency suppression function, in which a single modulator is utilized to form a photoelectric oscillator so as to generate high-quality and low-phase-noise optically generated local oscillators, without the need for an external local oscillator source, and at the same time, another radio-frequency port is used as a radio-frequency signal input port, thereby allowing a compact structure. By properly setting a bias point for the two-electrode modulator and orthogonally synthesizing two branches of intermediate frequency signals respectively generated by the upper and lower sideband beat frequencies of the modulated optical signal, the photonic radio-frequency receiver realizes the functions of receiving radio-frequency signals and suppressing mirror frequency signals. The present disclosure can realize a photonic mirror-frequency suppression receiver.

6 Claims, 1 Drawing Sheet

(56) References Cited

U.S. PATENT DOCUMENTS

| | | | |
|---|---|---|---|
| 2010/0021166 A1* | 1/2010 | Way | H04J 14/0256 |
| | | | 398/79 |
| 2015/0236789 A1* | 8/2015 | Vahala | H03L 7/08 |
| | | | 398/192 |
| 2018/0180655 A1* | 6/2018 | Kuse | G01R 29/26 |
| 2019/0115980 A1* | 4/2019 | Ikeda | H04B 10/50575 |
| 2019/0273562 A1* | 9/2019 | Benazet | H04B 10/118 |
| 2020/0112370 A1* | 4/2020 | Han | H04B 10/616 |

\* cited by examiner

PHOTONIC RADIO-FREQUENCY RECEIVER WITH MIRROR FREQUENCY SUPPRESSION FUNCTION

CROSS REFERENCE OF RELATED APPLICATIONS

The present application claims the benefit of China Patent Application No. 201910114554.7, entitled "PHOTONIC RADIO-FREQUENCY RECEIVER WITH MIRROR FREQUENCY SUPPRESSION FUNCTION" filed on Feb. 14, 2019, in the China National Intellectual Property Administration, the entire content of which is incorporated herein in its entirety.

TECHNICAL FIELD

The present disclosure belongs to the field of photoelectric technology and particularly relates to a photonic radio-frequency receiver with mirror frequency suppression function.

BACKGROUND

With the rapid development in the field of wireless communication electronic technology, wireless communication has increasingly higher requirements for the integration and flexibility of receivers, the compatibility of communication systems, the engineering application and other aspects. Radio-frequency receivers are the core structure of microwave radio-frequency systems such as wireless communication, electronic warfare, radar systems and satellite load systems, among others. Heterodyne structures are the most important receiver type among various receivers, because heterodyne receivers have the advantages of low spur, large dynamic range and high sensitivity.

However, heterodyne structures have the problem of mirror frequency interference. When the input signal contains radio-frequency and mirror-frequency signals (the mirror frequency and the radio frequency are symmetrical with respect to the local oscillation frequency), the radio-frequency signal and the mirror-frequency signal will be down-converted to the same intermediate frequency signal at the same time, while the intermediate frequency signal down-converted by the mirror-frequency signal cannot be filtered out due to spectral aliasing, thus distorting the radio-frequency signal to be tested and affecting the quality of the received signal of the system. In radar and communication systems, the use of mirror frequency suppression receivers can effectively suppress the mirror frequency and improve the interference capability of the system.

Photonics technology has high transmission capacity, flat response in microwave and millimeter wave frequency bands, anti-electromagnetic interference, low loss, low dispersion and other advantages, and at the same time, it also has the feature of ultra-wide-band tuning and has broad application prospects in radio-frequency and microwave fields, including up-down conversion in optical domain.

In recent decades, radio-frequency receivers based on photonics technology have been widely studied. Compared with electrical receivers, photonic receivers have the advantages of inherent large bandwidth, flexible tunability, potential integration and anti-EMC interference, among others.

In order to reduce the mirror frequency interference, one of the methods is to directly filter out the mirror frequency component from the input signal using an electric or optical filter in the electric or optical domain. However, a filter with high roll-off factor is hardly achievable for both electric and optical filters, so this method is not suitable for wide-band signals or low intermediate frequency signals.

SUMMARY OF THE DISCLOSURE

The present disclosure provides a photonic radio-frequency receiver with mirror frequency suppression function, wherein, a dual-electrode modulator is utilized to simultaneously provide a radio-frequency input port for radio-frequency and local oscillator signals, and in combination with a photoelectric oscillator and an optically generated low-phase-noise local oscillator signal, the function of direct receiving and down conversion in the optical domain is realized without the need for an external local oscillator, and the mirror frequency suppression function of the receiver is realized by setting a modulator bias point, utilizing the beat frequencies at the upper and lower sidebands in the optical domain and combining an orthogonal electric coupler.

The technical solution of the present disclosure is as follows:

A photonic radio-frequency receiver with mirror frequency suppression function, comprising:

a laser for outputting an optical carrier;

a dual-electrode modulator, which has an input connected to the output of the laser through an optical fiber cable and is used to modulate upper radio-frequency signals and local oscillator signals through the optical carrier output by the laser;

an optical coupler, which has an input connected to the output of the dual-electrode modulator through an optical fiber cable and is used to divide the modulated optical signal into three branch signals, namely an optical signal L1, an optical signal L2 and an optical signal L3;

a third photoelectric detector, which has an input connected to a third output branch of the optical coupler through an optical fiber cable and is used to convert the optical signal L3 into an electric signal;

an electric filter, which has an input connected to the output of the third photoelectric detector through a radio-frequency cable and is used for band-pass filtering of the electric signal;

an electric amplifier, which has an input connected to the output of the electric filter through a radio-frequency cable and is used to amplify the band-pass filtered electric signal so as to obtain the local oscillator signal, and the output of which is connected to a first radio-frequency port of the dual-electrode modulator through a radio-frequency cable;

a first optical filter, which has an input connected to a first output branch of the optical coupler through an optical fiber cable and is used to filter out the upper sideband of the optical signal L1 so as to obtain a filtered optical signal F1;

a first photoelectric detector, which has an input connected to the output of the first optical filter through an optical fiber cable and is used to convert the filtered optical signal F1 into an electric signal E1;

a second optical filter, which has an input connected to a second output branch of the optical coupler through an optical fiber cable and is used to filter out the lower sideband of the optical signal L2 so as to obtain a filtered optical signal F2;

a second photoelectric detector, which has an input connected to the output of the second optical filter through an optical fiber cable and is used to convert the filtered optical signal F2 into an electric signal E2;

an orthogonal electric coupler, which has an input respectively connected to the output of the first photoelectric detector and the output of the second photoelectric detector through radio-frequency cables and is used to couple the electric signal E1 and the electric signal E2 so as to form an electric signal output by the photonic radio-frequency receiver;

The bias point of the dual-electrode modulator is set at $\pi/4$ or $5\pi/4$. After the electric signal E1 and the electric signal E2 are synthesized by the orthogonal electric coupler, the two branches of electric signals E1 and E2 generated by the frequency conversion of the radio-frequency signal are superposed due to the same phase direction thereof, and the two branches of electric signals E1 and E2 generated by the frequency conversion of the mirror signal are canceled out due to the reverse phase direction thereof.

The dual-electrode modulator is a Mach-Zehnder modulator, and preferably, the dual-electrode modulator is a lithium niobate modulator.

The electric band-pass filter is a narrow-band high-Q (high quality value) filter, and the optical filter is an optical band-pass filter.

The laser is a highly stable laser that outputs linearly polarized light, and preferably, the laser is a semiconductor laser.

The beneficial effects of the present disclosure are as follows:

In the present disclosure, the laser, the dual-electrode modulator, the optical coupler, the third photoelectric detector, the electric filter and the electric amplifier form a photoelectric loop, i.e. the photoelectric oscillator. In the present disclosure, the single dual-electrode modulator is combined with the photoelectric oscillator to realize the dual input of the radio-frequency signal and the local oscillator signal, thereby allowing a more compact system structure. The photoelectric oscillator is utilized to generate the optically generated local oscillator signal, thus eliminating the need for an external high-quality and low-phase-noise local oscillator. The photonic mirror frequency suppression function is realized by setting a bias point for the dual-electrode modulator, utilizing the beat frequencies at the upper and lower sidebands in the optical domain and combining the orthogonal electric coupler. The present disclosure is suitable for systems such as wireless communication, radar, electronic warfare systems and the like.

BRIEF DESCRIPTION OF THE DRAWINGS

In order to more clearly explain the embodiments of the present disclosure, the accompanying drawings necessary to be used in the description of the embodiments or the prior art will be briefly introduced below. Obviously, the accompanying drawings in the following description are merely some embodiments of the present disclosure. For those of ordinary skill in the art, other drawings can be obtained on the basis of the accompanying drawings without creative efforts.

Figure 1:
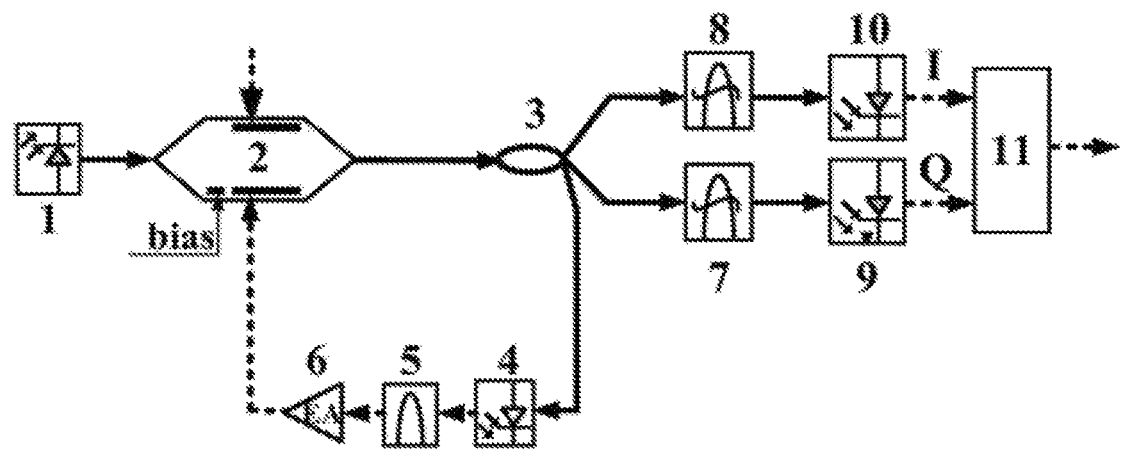
FIG. 1 illustrates a schematic view of the structure of the photonic radio-frequency receiver capable of mirror frequency suppression as specified in the present disclosure.

In the drawings: 1—laser, 2—dual-electrode modulator, 3—optical coupler, 4—photoelectric detector, 5—electric filter, 6—electric amplifier, 7—optical filter, 8—optical filter, 9—photoelectric detector, 10—photoelectric detector, and 11—orthogonal electric coupler.

DETAILED DESCRIPTION OF THE EMBODIMENTS

In order to make the object, technical solution and advantages of the present disclosure more comprehensible, the present disclosure is further described below with reference to the accompanying drawings and the embodiments. It should be understood that the specific embodiments described herein are only used to explain the present disclosure and are not intended to limit the scope of the present disclosure.

As shown in FIG. 1, the photonic radio-frequency receiver capable of mirror frequency suppression as specified in the present disclosure comprises a laser 1, dual-electrode modulator 2, optical coupler 3, photoelectric detector 4, electric band-pass filter 5, electric amplifier 6, optical filter 7, optical filter 8, photoelectric detector 9, photoelectric detector 10, and orthogonal electric coupler 11.

The laser 1, the two-electrode modulator 2, the optical coupler 3 and the photoelectric detector 4 are sequentially connected through optical fiber cables; the photoelectric detector 4, the electric band-pass filter 5, the electric amplifier 6, and the radio-frequency port of the dual-electrode modulator 2 are connected through radio-frequency cables; the optical coupler 3, the optical filter 7 and the photoelectric detector 9 are connected through optical fiber cables; the optical coupler 3, the optical filter 8 and the photoelectric detector 10 are connected through optical fiber cables; and the photoelectric detector 9, the photoelectric detector 10 and the orthogonal electric coupler 11 are connected through radio-frequency cables.

The laser 1 is used to output an optical carrier; the dual-electrode modulator 2 is used to modulate upper radio-frequency signals and local oscillator signals through the optical carrier; the optical coupler 3 is used to divide the modulated optical signal into three branch signals, namely L1, L2 and L3; the photoelectric detector 4 is used to convert the optical signal L3 into an electric signal; the electric band-pass filter 5 is used for band-pass filtering of the electric signal; the electric amplifier 6 is used to amplify the band-pass filtered electric signal so as to obtain the local oscillator signal; the optical filter 7 is used to filter out the upper sideband of the optical signal L1 so as to obtain a filtered optical signal F1; the optical filter 8 is used to filter out the lower sideband of the optical signal L2 so as to obtain a filtered optical signal F2; the photoelectric detector 9 and the photoelectric detector 10 are used to convert optical signals F1 and F2 into electric signals respectively to obtain electric signals E1 and E2; and the orthogonal electric coupler 11 is used to synthesize the electric signals E1 and E2 and output the synthesized electric signals, i.e. the output result.

The bias point of the dual-electrode modulator 2 is set at $\pi/4$ or $5\pi/4$. After the electric signals E1 and E2 are synthesized by the orthogonal electric coupler 11, the two branches of electric signals E1 and E2 generated by the frequency conversion of the radio-frequency signal are superposed due to the same phase direction thereof, and the two branches of electric signals E1 and E2 generated by the frequency conversion of the mirror signal are canceled out due to the reverse phase direction thereof.

In the embodiment, the dual-electrode modulator 2 is a Mach-Zehnder modulator, preferably a lithium niobate modulator. The electric band-pass filter 5 is a narrow-band high-Q filter. The laser 1 is a highly stable laser that outputs linearly polarized light, e.g. a semiconductor laser. The optical filters 7 and 8 are optical band-pass filters.

Figure 2:
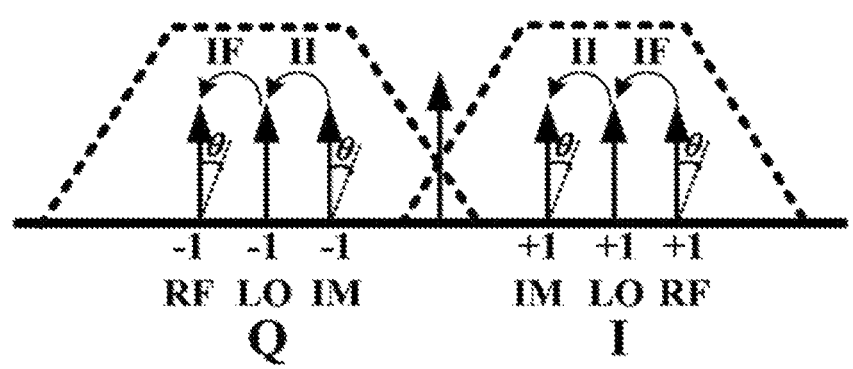
FIG. 2 illustrates a schematic view of the spectrum of the modulated optical signal set forth in the embodiments of the present disclosure.

The photonic radio-frequency receiver capable of mirror frequency suppression as specified in the embodiment has the following working principle:

The linearly polarized light output by the laser 1 is coupled into the dual-electrode modulator 2, transmitted through the optical fiber coupler 3, and fed to the photoelectric detector 4 for photoelectric conversion; the electrical signal output by the photoelectric detector 4 passes through the electric band-pass filter 5 and the electric amplifier 6, and finally the filtered and amplified radio-frequency signal is input into the radio-frequency port of the dual-electrode modulator 2, thus forming a photoelectric loop, i.e., a photoelectric oscillator structure. When the gain of the loop is greater than the loss thereof, the photoelectric oscillator starts to oscillate, and the starting oscillation frequency depends on the loop length and the pass-band frequency of the electric band-pass filter 5, and the oscillation frequency is the local oscillation frequency. Another radio-frequency port of the dual-electrode modulator modulates upper radio-frequency signals, including mirror frequency signals. Under small signal modulation, high-order sidebands are ignored, and the spectrum of radio-frequency signals and local oscillator signals modulated by the optical carrier is shown in FIG. 2. The modulated spectrum contains an optical carrier, a first-order component LO of the local oscillator signal, a first-order component RF of the radio-frequency signal and a first-order component IM of the mirror frequency signal.

The modulated optical signal passes through the optical fiber coupler 3 and is divided into three branch signals, wherein two paths of light are respectively fed into the optical filter 7 and the optical filter 8. The transmission responses of the optical filter 7 and the optical filter 8 are shown by dashed lines in FIG. 2. The filter 7 filters out the upper sideband frequency component of the optical signal, which is called I channel (In-phase channel), and the filter 8 filters out the lower sideband frequency component of the optical signal, which is called Q channel. The optical signals of I and Q channels are fed to photoelectric detectors 9 and 10 respectively and converted into electric signals. Since the radio-frequency signal and the mirror frequency signal are symmetrical in respect to the frequency of the local oscillation signal, the intermediate frequency signal IF obtained by the beat frequencies of the radio-frequency component and the local oscillation component as well as the intermediate frequency signal II obtained by the beat frequencies of the mirror frequency component and the local oscillation component have the same frequency. The bias point of the dual-electrode modulator is set at $\pi/4$ or $5\pi/4$, and the phase difference between the two branches of intermediate frequency signals IF generated by I and Q channels is $\pi/2$, while the phase difference between the two branches of intermediate frequency signals II generated by I and Q channels is $3\pi/2$. The two branches of intermediate frequency signals are combined by the orthogonal electric coupler 11. The orthogonal coupler introduces an additional phase of $\pi/2$, and the intermediate frequency signals IF of I and Q channels have a phase difference of 0 after being synthesized, so they are superposed in the same phase and thus strengthened. The intermediate frequency signals II of I and Q channels have a phase difference of it after being synthesized, so they are canceled out in the same phase and thus suppressed. Therefore, after the desired radio-frequency signal is received, it is converted to an intermediate frequency signal and successfully received, while after the mirror frequency signal is received, it is canceled out due to reverse superposition, and thus the receiver realizes the mirror frequency suppression function.

The technical scheme and beneficial effects of the present disclosure have been described in detail in the above-mentioned specific embodiments. It should be understood that the above-mentioned description is merely the most preferred embodiment of the present disclosure and is not intended to limit the present disclosure, and any modifications, supplements and equivalent substitutions made within the scope of the principles of the present disclosure are intended to be included within the protection scope of the present disclosure.

What is claimed is:

1. A photonic radio-frequency receiver with mirror frequency suppression function, comprising:

a laser for outputting an optical carrier;

a dual-electrode modulator comprising an input connected to an output of the laser through an optical fiber cable and is used to modulate upper radio-frequency signals and local oscillator signals through an optical carrier output by the laser;

an optical coupler comprising an input connected to the output of the dual-electrode modulator through an optical fiber cable and is used to divide the modulated optical signal into three branch signals, the three branch signals comprising an optical signal L1, an optical signal L2 and an optical signal L3;

a third photoelectric detector, comprising an input connected to the optical coupler through an optical fiber cable and is used to convert the optical signal L3 into an electric signal;

an electric filter comprising an input connected to an output of the third photoelectric detector through a radio-frequency cable and is used for band-pass filtering of the electric signal;

an electric amplifier comprising an input connected to an output of the electric filter through a radio-frequency cable and is used to amplify the band-pass filtered electric signal so as to obtain the local oscillator signal, and an output connected to a first radio-frequency port of the dual-electrode modulator through a radio-frequency cable;

a first optical filter comprising an input connected to a first output branch of the optical coupler through an optical fiber cable and is used to filter out an upper sideband of the optical signal L1 so as to obtain a filtered optical signal F1;

a first photoelectric detector, which has an input connected to an output of the first optical filter through an optical fiber cable and is used to convert the filtered optical signal F1 into an electric signal E1;

a second optical filter, which has an input connected to a second output branch of the optical coupler through an optical fiber cable and is used to filter out a lower sideband of the optical signal L2 so as to obtain a filtered optical signal F2;

a second photoelectric detector, which has an input connected to an output of the second optical filter through an optical fiber cable and is used to convert the filtered optical signal F2 into an electric signal E2;

an orthogonal electric coupler, which has an input respectively connected to an output of the first photoelectric detector and an output of the second photoelectric detector through radio-frequency cables and is used to couple the electric signal E1 and the electric signal E2 so as to form an electric signal output by a photonic radio-frequency receiver;

a bias point of the dual-electrode modulator is set at π/4 or 5π/4. After the electric signal E1 and the electric signal E2 are synthesized by the orthogonal electric coupler, two branches of the electric signals E1 and E2 generated by the frequency conversion of the radio-frequency signal are superposed due to the same phase direction thereof, and the two branches of the electric signals E1 and E2 generated by a frequency conversion of a mirror signal are canceled out due to the reverse phase direction thereof.

2. The photonic radio-frequency receiver with mirror frequency suppression function as specified in claim 1, wherein the dual-electrode modulator is a Mach-Zehnder modulator.

3. The photonic radio-frequency receiver with mirror frequency suppression function as specified in claim 1, wherein the dual-electrode modulator is a lithium niobate modulator.

4. The photonic radio-frequency receiver with mirror frequency suppression function as specified in claim 1, wherein the electric band-pass filter is a narrow-band high-Q filter.

5. The photonic radio-frequency receiver with mirror frequency suppression function as specified in claim 1, wherein the laser is a semiconductor laser.

6. The photonic radio-frequency receiver with mirror frequency suppression function as specified in claim 1, wherein the optical filter is an optical band-pass filter.

\* \* \* \* \*